(12) United States Patent
Little

(10) Patent No.: US 11,387,792 B2
(45) Date of Patent: Jul. 12, 2022

(54) LOUDSPEAKER SYSTEM AND ELECTRONICS DEVICE

(71) Applicant: Goertek Inc., Shandong (CN)

(72) Inventor: Richard Warren Little, Shandong (CN)

(73) Assignee: Goertek Inc., Weifang (CN)

( * ) Notice: Subject to any disclaimer, the term of this patent is extended or adjusted under 35 U.S.C. 154(b) by 96 days.

(21) Appl. No.: 16/930,606

(22) Filed: Jul. 16, 2020

(65) Prior Publication Data

US 2021/0028750 A1    Jan. 28, 2021

Related U.S. Application Data

(60) Provisional application No. 62/878,846, filed on Jul. 26, 2019.

(51) Int. Cl.
| | |
|---|---|
| *H03F 3/20* | (2006.01) |
| *H03F 1/02* | (2006.01) |
| *H04R 3/00* | (2006.01) |
| *H04R 29/00* | (2006.01) |

(52) U.S. Cl.
CPC ............... *H03F 3/20* (2013.01); *H03F 1/02* (2013.01); *H04R 3/00* (2013.01); *H04R 29/001* (2013.01); *H03F 2200/03* (2013.01)

(58) Field of Classification Search
CPC .......... H03F 1/02; H03F 1/0222; H03F 1/025; H03F 1/32; H03F 2200/03; H03F 3/181; H03F 3/20; H04R 29/001; H04R 3/00
USPC .............................................. 381/59
See application file for complete search history.

(56) References Cited

U.S. PATENT DOCUMENTS

| | | | |
|---|---|---|---|
| 2016/0197588 A1* | 7/2016 | Olson | H03F 3/68 |
| | | | 381/120 |
| 2017/0207696 A1 | 7/2017 | Ishii et al. | |
| 2017/0215004 A1* | 7/2017 | Wengreen | H04R 1/026 |

* cited by examiner

*Primary Examiner* — Paul Kim
*Assistant Examiner* — Friedrich Fahnert
(74) *Attorney, Agent, or Firm* — Baker Botts, LLP

(57) ABSTRACT

The present invention discloses a loudspeaker system and an electronics device. The loudspeaker system comprises: a power amplifier, which amplifies an input audio signal; a transducer, connected to the power amplifier, which receives the amplified input audio signal and converts it into a sound wave; a power supply, which provides current to the power amplifier; and a secondary battery, wherein the secondary battery provides extra current to the power amplifier when the power amplifier needs a higher current to actuate the transducer.

6 Claims, 2 Drawing Sheets

LOUDSPEAKER SYSTEM AND ELECTRONICS DEVICE

CROSS-REFERENCE TO RELATED APPLICATION

This application claims priority to U.S. Provisional Utility Patent Application No. 62/878,846, filed on Jul. 26, 2019, which is hereby incorporated by reference in its entirety.

FIELD OF THE INVENTION

The present invention relates to loudspeaker, and more specifically, to a loudspeaker system and an electronics device.

BACKGROUND OF THE INVENTION

Audio transducers are inherently nonlinear devices. The suspension system for the moving parts are like a spring, with a constant spring constant at small displacements, but with a non-constant spring constant at higher displacements. The motor force constant (BL) is also constant at lower displacements, but not constant at higher displacements. The operation of the device, when a sinusoidal current is fed into the transducer, is linear (sinusoidal motion) at small displacements, but not linear at high signal levels (a clipped sinusoidal signal might occur). Nonlinear operation results in a distorted soundwave (we hear distortion in the sound wave when it reaches our ears). FIG. 1 shows a graph illustrating this clipped signal. In FIG. 1, when the displacement 11 is within the limits, it is a sinusoidal motion. When the displacement 12 is out of the limits, the motion becomes a clipped one, in which the portion A is clipped and the portion B is left.

There are complicated feedback systems which exist in the industry to provide compensation for the nonlinear operation of the transducer. Essentially, they operate by monitoring the state of the transducer constantly, and applying additional current to the transducer when required to compensate for the nonlinear device operation.

SUMMARY OF THE INVENTION

One object of this invention is to provide a new technical solution for loudspeaker system.

According to a first aspect of the present invention, there is provided a loudspeaker system, comprising: a power amplifier, which amplifies an input audio signal; a transducer, connected to the power amplifier, which receives the amplified input audio signal and converts it into a sound wave; a power supply, which provides current to the power amplifier; and a secondary battery, wherein the secondary battery provides extra current to the power amplifier when the power amplifier needs a higher current to actuate the transducer.

According to a second aspect of the present invention, there is provided an electronics device comprising the loudspeaker system according to an embodiment of this disclosure.

According to an embodiment of this disclosure, an extra current driving ability can be provided when needed.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
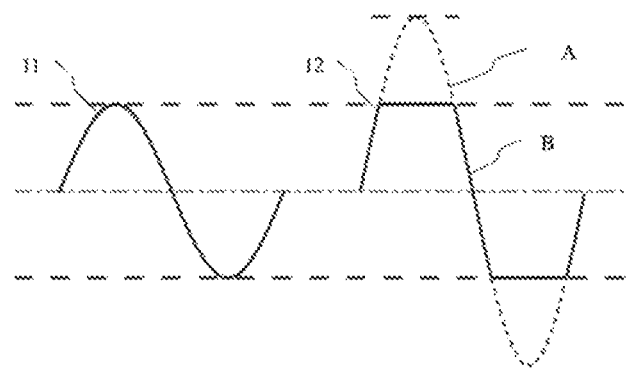
FIG. 1 is a graph illustrating a clipped signal.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Figure 2:
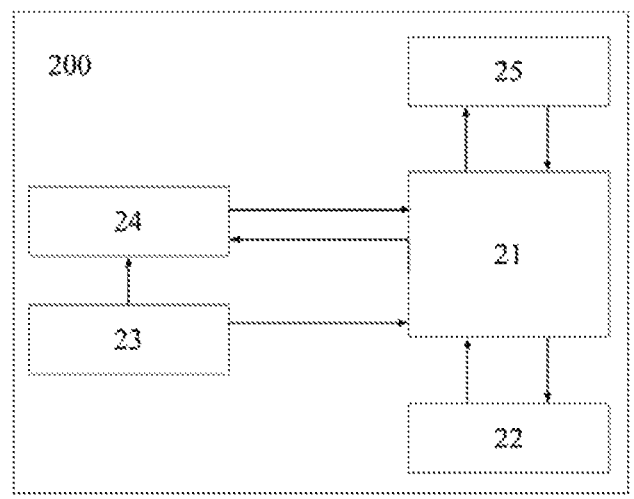
FIG. 2 is a block diagram of a loudspeaker system according to an embodiment of this disclosure.

FIG. 2 is a block diagram of a loudspeaker system according to an embodiment of this disclosure.

As shown in FIG. 2, the loudspeaker system 200 comprises a power amplifier 21, a transducer 22, a power supply 23 and a secondary battery 24.

The power amplifier 21 amplifies an input audio signal. The transducer 22 is connected to the power amplifier 21. The transducer 22 receives the amplified input audio signal and converts it into a sound wave. The power supply 23 provides current to the power amplifier 21. The secondary battery 24 provides extra current to the power amplifier 21 when the power amplifier 21 needs a higher current to actuate the transducer 22.

Here, the higher current means a current higher than a normal current. The power supply 23 can provide this normal current to the power amplifier 21 and under the normal current, the power supply 23 can drive the transducer 22 to work in an acceptable linear region.

It should be understood by a person skilled in the art that although the power supply 23 is shown in FIG. 2 to be connected to only the secondary battery 24 and the power amplifier 21, it can also be connected to other components and provide power to them. Similarly, the secondary battery 24 can also be connected to other components.

By means of the provision of the extra current when needed or at the motion peaks of the transducer 22, the clipped motion of the transducer 22 can be converted to be unclipped to some degree. The extra current can overcome the extra spring stiffness or reduction in motor force at high displacements of the transducer.

The power amplifiers are real-world devices that also have operational limits. Typically, they have voltage "rail" limits, which means that they have limits on the current and voltage they can provide to a transducer during operation. More powerful power supplier and amplifier chips cost more, and generate more heat. So, minimizing power supply size and amplifier power rails is desirable.

Furthermore, in cases where we want to add the nonlinear feedback system to a loudspeaker system which has a power limited or thermal limited electrical architecture, the feedback system will have problems operating properly at full power signals, because there will be no extra current capacity in the electrical system, to operate the feedback system.

In this embodiment, we store energy in the secondary battery and provide extra current by the secondary battery when needed. This means that we move the energy during lower displacements of the transducer to the period of higher displacements. This can improve the usage of the energy and is power-efficient. Furthermore, it can compensate the driving of the power amplifier without a complicated power supply and thus is design efficient.

This extra current capacity of the secondary battery can be used to operate a feedback system under full power type conditions. It will allow the power supply and amplifier to be kept smaller than otherwise. The secondary battery allows for other additional functionality. It can be portability.

In an example, the secondary battery 24 provides the extra current when a level of the input audio signal is higher than a pre-determined level.

Figure 4:
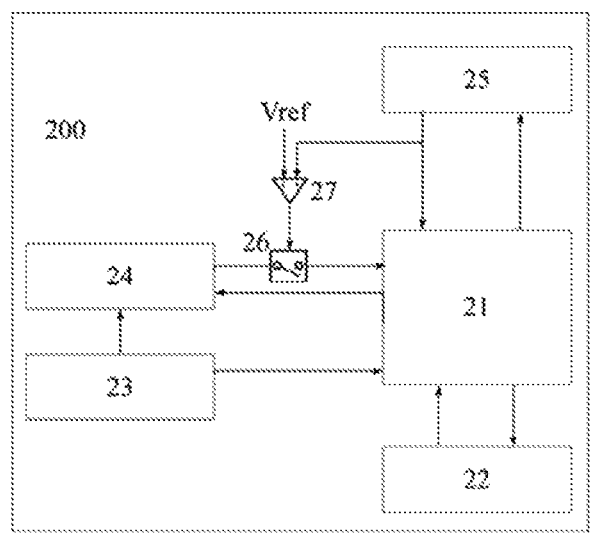
FIG. 4 shows an example of a loudspeaker system according to an embodiment of this disclosure.

FIG. 4 shows an example of the loudspeaker system. As shown in FIG. 4, a switch 27 can be provided in the power connection path between the secondary battery 24 and the power amplifier 21. When it is detected that the level of the input audio signal is higher than a pre-determined level, the switch 27 can be turned on and the extra current is provided to the power amplifier 21. In FIG. 4, a comparator 26 is connected to the switch 27. The positive port of the comparator 26 is connected to the input audio signal, and the negative port of the comparator 26 is connected to a reference voltage Vref with pre-determined level. When the positive level of the input audio signal is higher than a pre-determined level, the comparator 26 outputs a high level to set the switch 27 to be in conducted status and the extra current is provided to the power amplifier 21 from the secondary battery 24. While FIG. 4 shows an example of boosting positive input audio signal, a similar circuit can be provided to boost a negative input audio signal. For example, the negative input audio signal can first be reversed and then be connected to the positive port. A circuit for the positive input audio signal and a circuit for the negative input audio signal can be combined to control the switch 27. In this case, the switch 27 will be in conducted status when the level of either positive input audio signal or negative input audio signal is higher than the pre-determined level. Here, a level of a signal means the absolute amplitude of the signal. Although a voltage level is used here as an example of level, it can include current level.

The power amplifier 21 may be that known in the prior art. It may contain an input circuit, a boost circuit and an output circuit. The pre-determined level may be a level determined as a reverse function of the amplification ratio of the power amplifier, and may be, for example, the higher the amplification ratio is, the lower the pre-determined level.

In another example, the power amplifier 21 measures at least one of current and voltage of the transducer 22 and determine that it needs the higher current based on the measured at least one of current and voltage. For example, it can determine the status of the transducer based the current, the voltage or the power (the combination of the current and voltage) of the transducer. For example, if any of these parameters exceeds a respective threshold, the power amplifier 21 will need the extra current to compensate its driving current.

As shown in FIG. 2, the loudspeaker system 200 further comprises a control unit 25, which converts input audio data into the input audio signal and sends the input audio signal to the power amplifier. The control unit 25 may be a system on a chip (SOC). It may contain software for a nonlinear audio feedback system.

The input audio data may be stored in local memory, or may be obtained through WiFi, Bluetooth, and so on.

The control unit 25 may receive the at least one of current and voltage of the transducer 22 measured by the power amplifier 21. The control unit 25 can also determine the status of the transducer 22 based on the at least one of current and voltage. In this regard, the control unit 25 can instruct the secondary battery to provide the extra current directly or via the power amplifier 21.

In addition, because the control unit 25 has the input audio data to be played by the transducer, it can predict the amplitude of the moving part of the transducer. In this regard, the control unit 25 can determine that the power amplifier needs the higher current based on the input audio data and controls the secondary battery 24 to provide the extra current.

The secondary battery 24 is a rechargeable battery. The power supply 23 can include a power adapter, and may also include a rechargeable battery. The capacity of the rechargeable battery of the power supply 23 may be larger than that of the secondary battery 24.

The secondary battery 24 can be constantly charged through the power supply 23 when the power supply 23 is plugged in a power socket.

In an example, the secondary battery 24 is constantly charged through the power supply 23 regardless of whether the power supply 23 is plugged or not. In this regard, the secondary battery 24 could be a small battery. It functions as an energy-storage unit when an extra current is not needed and the power supply 23 can provide sufficient power to the power amplifier 21. When the power amplifier 21 needs an extra current, the secondary battery 24 can provide the stored energy to support the driving of the transducer 22. This design can be power efficient. Furthermore, this design is simple because it does not need a charging control to start/stop charging of the secondary battery 24 when the power supply 23 is plugged or not.

In another example, the secondary battery 24 is charged through the power supply 23 when it does not supply the extra current, and stops being charged when it supply the extra current. In this regard, the secondary battery 24 will not consume current when it provides the extra current, and the power supply 23 may save the current part to the secondary battery 24 and send it to the power amplifier 21. This can further increase the current supplied to the power amplifier 21.

Figure 3:
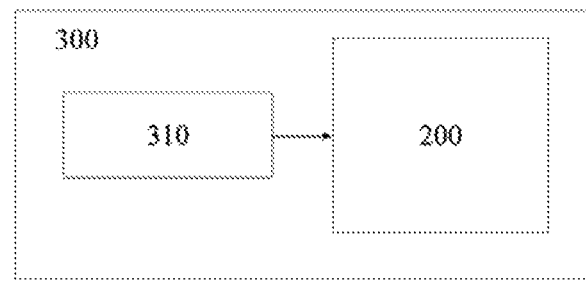
FIG. 3 is a block diagram of an electronics device according to an embodiment of this disclosure.

FIG. 3 is a block diagram of an electronics device according to an embodiment of this disclosure.

As shown in FIG. 3, the electronics device 300 comprises the loudspeaker system 200 as described above. The electronics device 300 may further comprises other components 310 such as a processor, a memory, a communication component, a display and so on.

This electronics device 300 may a sound box, a sound bar and so on.

Although some specific embodiments of the present invention have been demonstrated in detail with examples, it should be understood by a person skilled in the art that the above examples are only intended to be illustrative but not to limit the scope of the present invention.

What is claimed is:

1. A loudspeaker system for converting an input audio signal into a sound wave, comprising:
    a power amplifier, configured to amplify the input audio signal;
    a transducer, connected to the power amplifier, configured to receive the amplified input audio signal and convert it into the sound wave;
    a power supply, coupled to the power amplifier directly to provide current thereto; and
    a secondary battery,
    wherein the secondary battery is configured to provides extra current to the power amplifier when the power amplifier needs extra current to actuate the transducer,
    wherein the secondary battery is a rechargeable battery, and
    wherein the secondary battery is charged through the power supply when it does not supply the extra current, and stops being charged when it supplies the extra current.

2. The loudspeaker system according to claim 1, wherein the secondary battery provides extra current when a level of the input audio signal is higher than a predetermined level.

3. The loudspeaker system according to claim 1, wherein the power amplifier measures at least one of a current and a voltage of the transducer and determine that it needs the higher current based on the measured current and/or voltage.

4. The loudspeaker system according to claim 1, further comprising: a control unit, which converts input audio data into the input audio signal and sends the input audio signal to the power amplifier.

5. The loudspeaker system according to claim 4, wherein the control unit determines that the power amplifier needs the extra current based on the input audio data and controls the secondary battery to provide the extra current.

6. An electronics device comprising the loudspeaker system according to claim 1.

* * * * *